(12) United States Patent
Wang

(10) Patent No.: US 11,676,552 B2
(45) Date of Patent: Jun. 13, 2023

(54) DISPLAY PANEL AND ELECTRONIC DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Haijun Wang, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 118 days.

(21) Appl. No.: 17/293,425

(22) PCT Filed: Apr. 30, 2021

(86) PCT No.: PCT/CN2021/091651
§ 371 (c)(1),
(2) Date: May 12, 2021

(87) PCT Pub. No.: WO2022/222190
PCT Pub. Date: Oct. 27, 2022

(65) Prior Publication Data
US 2022/0343870 A1    Oct. 27, 2022

(30) Foreign Application Priority Data
Apr. 23, 2021 (CN) .......... 202110439164.4

(51) Int. Cl.
G09G 3/36    (2006.01)
G06F 3/041   (2006.01)

(52) U.S. Cl.
CPC ......... *G09G 3/3611* (2013.01); *G06F 3/0412* (2013.01); *G09G 2300/0842* (2013.01);
(Continued)

(58) Field of Classification Search
None
See application file for complete search history.

(56) References Cited

U.S. PATENT DOCUMENTS

2012/0112047 A1    5/2012  Brown et al.
2012/0236223 A1*   9/2012  Chen .................. G06F 3/04166
                                                250/214.1
(Continued)

FOREIGN PATENT DOCUMENTS

CN    103034365 A    4/2013
CN    106409198 A    2/2017
(Continued)

*Primary Examiner* — Christopher R Lamb
(74) *Attorney, Agent, or Firm* — PV IP PC; Wei Te Chung; Zhigang Ma

(57) ABSTRACT

A display panel and an electronic device are disclosed. The display panel includes a display area and a functional area. The functional area includes a first switch transistor, a second switch transistor, a sensing transistor, and a sensing capacitor. Specifically, an upper plate of the sensing capacitor is a transparent plate. The functional area can also serve a displaying function while performing color temperature sensing, gas sensing, or laser sensing, which increases an aperture ratio and transmittance of the display panel, so that an overall visual effect of the display panel is improved.

20 Claims, 5 Drawing Sheets

(52) U.S. Cl.
CPC ... *G09G 2310/08* (2013.01); *G09G 2330/023* (2013.01); *G09G 2354/00* (2013.01)

(56) References Cited

U.S. PATENT DOCUMENTS

| | | | | |
|---|---|---|---|---|
| 2013/0287274 | A1* | 10/2013 | Shi | G06V 40/12 |
| | | | | 345/174 |
| 2014/0168157 | A1* | 6/2014 | Yang | G06F 3/0445 |
| | | | | 345/174 |
| 2016/0163247 | A1 | 6/2016 | Lee et al. | |
| 2018/0090103 | A1* | 3/2018 | Zhang | G01K 13/00 |
| 2018/0130857 | A1* | 5/2018 | Lee | H01L 27/323 |
| 2019/0138131 | A1* | 5/2019 | Kim | G06V 40/1306 |
| 2021/0173544 | A1* | 6/2021 | Yang | G06F 3/04166 |

FOREIGN PATENT DOCUMENTS

| | | |
|---|---|---|
| CN | 108257549 A | 7/2018 |
| CN | 108877653 A | 11/2018 |
| CN | 110189706 A | 8/2019 |
| CN | 111816122 A | 10/2020 |
| CN | 112071277 A | 12/2020 |
| CN | 113138477 A | 7/2021 |

* cited by examiner

DISPLAY PANEL AND ELECTRONIC DEVICE

CROSS-REFERENCE TO RELATED APPLICATIONS

This application is a 371 U.S. National Stage of International Application No. PCT/CN2021/091651, filed on Apr. 30, 2021, which claims priority to Chinese Application No. 202110439164.4, filed on Apr. 23, 2021. The entire disclosures of the above applications are incorporated herein by reference.

BACKGROUND OF INVENTION

1. FIELD OF INVENTION

The present invention relates to a technical field of displays, and particularly to a display panel and an electronic device.

2. RELATED ART

With ever-changing development of display technologies, consumers' requirements for display panels keep increasing, and various display panels are continuously emerging and have been developing rapidly. Thin-film transistor liquid crystal displays (TFT-LCDs) have been widely used in display industries because of their characteristics of being light, thin, and small, as well as low power consumption, no radiation, and relatively low manufacturing cost. In order to expand commercial and home appliance applications of LCD displays, many functions are now integrated into display panels, such as color temperature sensing, laser sensing, and gas sensing, which improve application scenarios of LCD panels. However, many of integrated functions are still in a research and development stage, and there are still many processes and related designs that need to be improved in order to enhance the performance of LCDs with multiple integrated functions.

An overall structure of multifunctional display panels is divided into a display area and a functional area. The display area is responsible for color conversion of the display panels. The functional area is designed to realize color temperature sensing, laser sensing, and other functions through a number of thin-film transistors with sensing functions and capacitors that can be used to store charges. The introduction of the functional area is bound to improve an overall function of the display panel.

Because certain wirings in the functional area is an opaque metal layer, and a large area of an opaque storage capacitor is required, the functional area will seriously reduce an overall aperture ratio and transmittance of the display panels, and adversely affect an overall visual effect of the display panels, thereby seriously hindering the application and promotion of multifunctional display panels.

Accordingly, it is necessary to propose a novel technical solution to solve the above-mentioned technical problems.

SUMMARY OF INVENTION

An object of the embodiment of the present invention is to provide a display panel and an electronic device to increase an aperture ratio of the display panel.

To achieve the above-mentioned object, an embodiment of the present application provides a display panel, comprising a display area and a functional area, the display area defined on a side of the functional area, and the functional area comprising a first driving circuit, wherein the first driving circuit comprises a first switch transistor comprising a control terminal receiving a first scan signal, an input terminal included in the first switch transistor receiving a first data signal, and an output terminal included in the first switch transistor coupled to a first node; a second switch transistor comprising a control terminal receiving a second scan signal, an input terminal included in the second switch transistor receiving the first data signal, and an output terminal included in the second switch transistor outputting a readable signal; a sensing transistor comprising a control terminal receiving a third scan signal, an input terminal included in the sensing transistor receiving a power signal, and an output terminal included in the sensing transistor coupled to the first node; and a sensing capacitor comprising an upper plate coupled to a second node, and a lower plate coupled to the first node, wherein the upper plate of the sensing capacitor is a transparent plate, and the lower plate of the sensing capacitor is a metal plate.

In the display panel provided by an embodiment of the present application, a plurality of combinations of voltage levels of the first scan signal, the first data signal, the second scan signal, the third scan signal, and the power signal are corresponding to a detection phase, a read phase, and a display phase, sequentially.

In the display panel provided by an embodiment of the present application, in the detection phase, the third scan signal and the power signal are at a high voltage level, and the first data signal, the first scan signal, and the second scan signal are at a low voltage level.

In the display panel provided by an embodiment of the present application, in the read phase, the first scan signal and the second scan signal are at a high voltage level, and the first data signal, the third scan signal, and the power signal are at a low voltage level.

In the display panel provided by an embodiment of the present application, in the display phase, the first data signal and the first scan signal are at a high voltage level, and the second scan signal, the third scan signal, and the power signal are at a low voltage level.

In the display panel provided by an embodiment of the present application, one of the combinations of the voltage levels of the first scan signal, the first data signal, the second scan signal, the third scan signal, and the power signal is further corresponding to a recovery phase defined between the read phase and the display phase.

In the display panel provided by an embodiment of the present application, each of the first scan signal, the first data signal, the second scan signal, the third scan signal, and the power signal is at a low voltage level in the recovery phase.

In the display panel provided by an embodiment of the present application, a second driving circuit is disposed in the display area and comprises a display transistor, a storage capacitor, and a light-emitting device; wherein the display transistor comprises a control terminal receiving a fourth scan signal, an input terminal included in the display transistor receiving a second data signal, an output terminal included in the display transistor coupled to a first plate included in the storage capacitor, and a first terminal included in the light-emitting device coupled to a second plate included in the storage capacitor.

In the display panel provided by an embodiment of the present application, the first plate of the storage capacitor and the upper plate of the sensing capacitor are arranged in a same layer, and the second plate of the storage capacitor and the lower plate of the sensing capacitor are arranged in a same layer.

An embodiment of the present application further provides an electronic device, comprising a display panel and a touch assembly disposed on the display panel or integrated in the display panel, the display panel comprising a display area and a functional area, the display area defined on a side of the functional area, and the functional area comprising a first driving circuit, wherein the first driving circuit comprises a first switch transistor comprising a control terminal receiving a first scan signal, an input terminal included in the first switch transistor receiving a first data signal, and an output terminal included in the first switch transistor coupled to a first node; a second switch transistor comprising a control terminal receiving a second scan signal, an input terminal included in the second switch transistor receiving the first data signal, and an output terminal included in the second switch transistor outputting a readable signal; a sensing transistor comprising a control terminal receiving a third scan signal, an input terminal included in the sensing transistor receiving a power signal, and an output terminal included in the sensing transistor coupled to the first node; and a sensing capacitor comprising an upper plate coupled to a second node, and a lower plate coupled to the first node, wherein the upper plate of the sensing capacitor is a transparent plate, and the lower plate of the sensing capacitor is a metal plate.

Further, a plurality of combinations of voltage levels defined by the first scan signal, the first data signal, the second scan signal, the third scan signal, and the power signal are corresponding to a detection phase, a read phase, and a display phase, sequentially.

Further, in the detection phase, the third scan signal and the power signal are at a high voltage level, and the first data signal, the first scan signal, and the second scan signal are at a low voltage level.

Further, in the read phase, the first scan signal and the second scan signal are at a high voltage level, and the first data signal, the third scan signal, and the power signal are at a low voltage level.

Further, in the display phase, the first data signal and the first scan signal are at a high voltage level, and the second scan signal, the third scan signal, and the power signal are at a low voltage level.

Further, one of the combinations of the voltage levels defined by the first data signal, the second scan signal, the third scan signal, and the power signal is further corresponding to a recovery phase defined between the read phase and the display phase.

Further, each of the first scan signal, the first data signal, the second scan signal, the third scan signal, and the power signal is at a low voltage level in the recovery phase.

Further, a second driving circuit is disposed in the display area and comprises a display transistor, a storage capacitor, and a light-emitting device; wherein the display transistor comprises a control terminal receiving a fourth scan signal, an input terminal included in the display transistor receiving a second data signal, an output terminal included in the display transistor coupled to a first plate included in the storage capacitor, and a first terminal included in the light-emitting device coupled to a second plate included in the storage capacitor.

Further, the first plate of the storage capacitor and the upper plate of the sensing capacitor are arranged in a same layer, and the second plate of the storage capacitor and the lower plate of the sensing capacitor are arranged in a same layer.

Further, the detection phase, the read phase, and the display phase are defined as a period, and the period is between one microsecond and 10 seconds.

The present application has advantageous effects as follows: the embodiment of the present application provides a display panel and an electronic device. The display panel includes a display area and a functional area. The functional area includes a first switch transistor, a second switch transistor, a sensing transistor, and a sensing capacitor. Specifically, an upper plate of the sensing capacitor is a transparent plate. The functional area can also serve a displaying function while performing color temperature sensing, gas sensing, or laser sensing, which improves an aperture ratio and transmittance of the display panel, thereby enhancing an overall visual effect of the display panel.

In addition, the embodiment of the present application improves driving circuits in the functional area, modifies a conventional 2T1C (two transistors and one capacitor) driving circuit structure as a 3T1C (three transistors and one capacitor) driving circuit structure, and performs a periodic setting on a signal source of the driving circuits, so that the functional area can achieve an effect of the display area.

In order to make the above-mentioned content of this application more obvious and understandable, preferred embodiments are specifically described below in conjunction with the accompanying drawings, which are described in detail as follows.

BRIEF DESCRIPTION OF DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

In order to make the purpose, technical solutions, and advantages of this application clearer, the application will be further described in detail below with reference to the accompanying drawings. Please refer to the figures in the accompanying drawings, wherein the same component symbols represent the same components. The following description is based on the specific embodiments of the present application, which should not be regarded as limiting other specific embodiments of the application that are not described in detail herein. The word "embodiment" used in this specification means instance, example, or illustration.

The embodiments of the present application provide a display panel and an electronic device, which will be described in detail below. It should be noted that the order of description in the following embodiments is not meant to limit the preferred order of the embodiments.

It should be noted that the display panel provided by the embodiment of the present application may be a thin-film transistor liquid crystal display (TFT-LCD).

Figure 1:
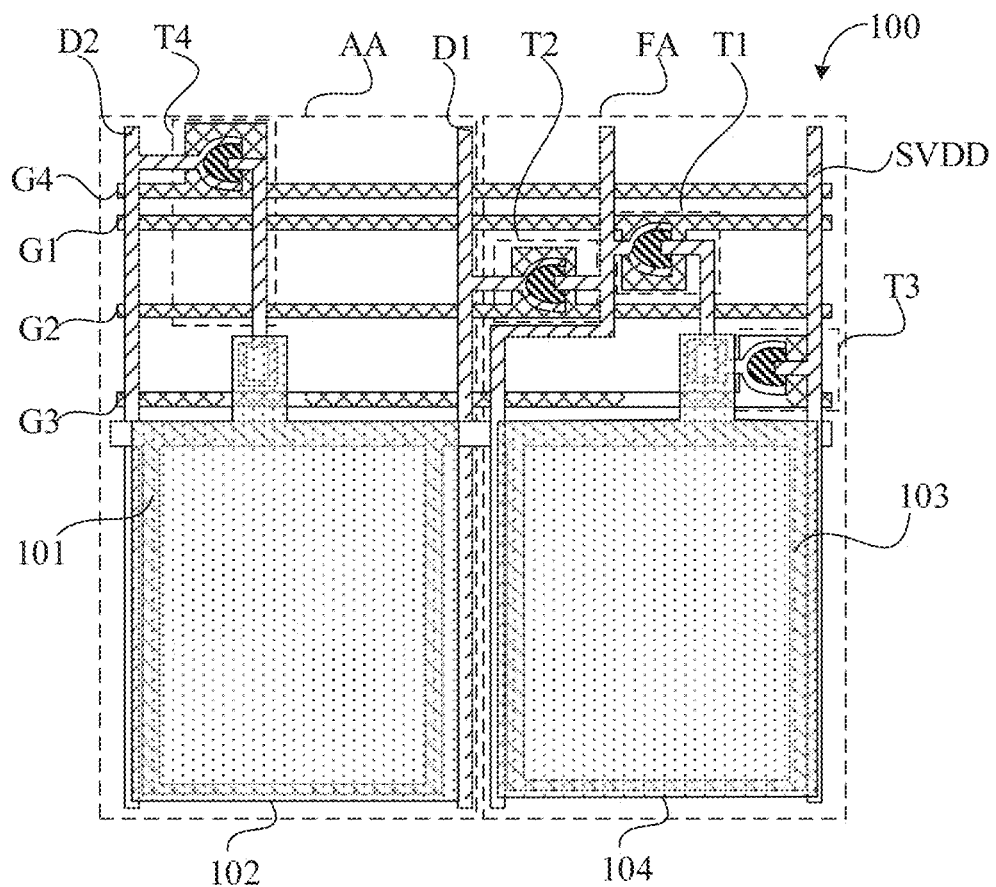
FIG. 1 is a schematic plan view of a display panel provided by an embodiment of the present application.
Figure 2:
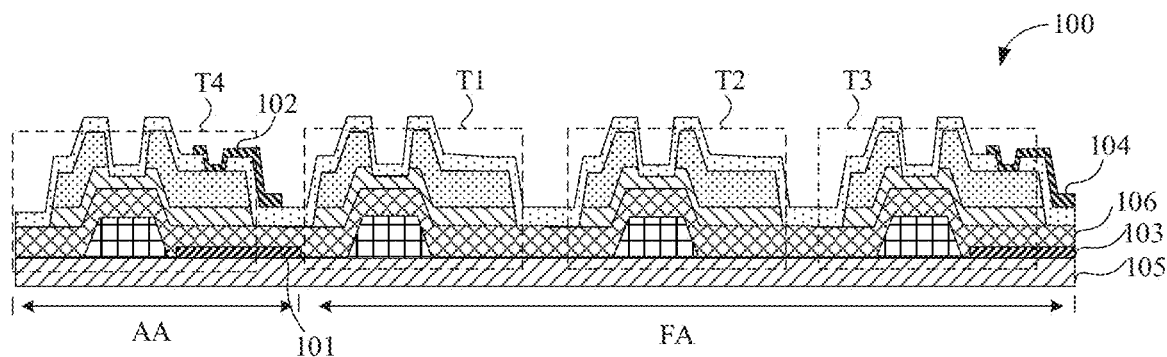
FIG. 2 is a schematic structural view of the display panel provided by the embodiment of the present application.
Figure 3:
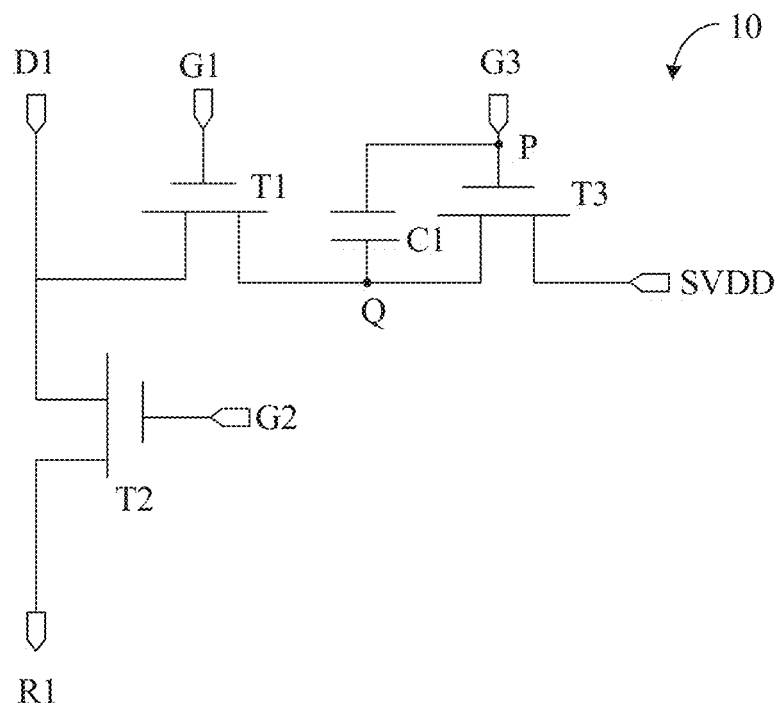
FIG. 3 is a schematic view of a first driving circuit of the display panel provided by the embodiment of the present application.
Figure 4:
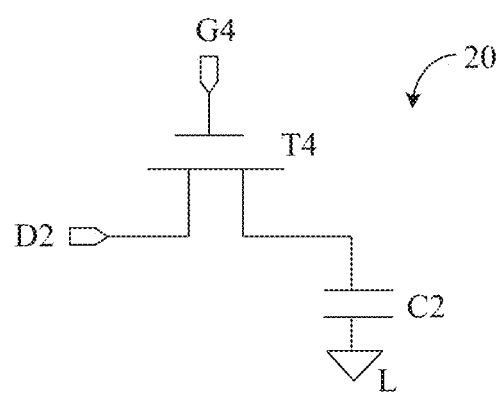
FIG. 4 is a schematic view of a second driving circuit of the display panel provided by the embodiment of the present application.

Please refer to FIGS. 1, 2, 3, and 4. FIG. 1 is a schematic plan view of a display panel provided by an embodiment of the present application, FIG. 2 is a schematic structural view of the display panel provided by the embodiment of the present application, FIG. 3 is a schematic view of a first driving circuit of the display panel provided by the embodiment of the present application, and FIG. 4 is a schematic view of a second driving circuit of the display panel provided by the embodiment of the present application.

A display panel 100 includes a display area AA and a functional area FA. The display area AA is defined on a side of the functional area FA, and the functional area FA is provided with a first driving circuit 10, wherein the first driving circuit 10 includes a first switch transistor T1, a second switch transistor T2, a sensing transistor T3, and a sensing capacitor C1. The display area AA includes a second driving circuit 20 including a display transistor T4, a storage capacitor C2, and a light-emitting device L.

Specifically, a control terminal of the first switch transistor T1 receives a first scan signal G1, an input terminal of the first switch transistor T1 receives a first data signal D1, and an output terminal of the first switch transistor T1 is coupled to a first node Q.

A control terminal of the second switch transistor T2 receives a second scan signal G2, an input terminal of the second switch transistor T2 receives the first data signal D1, and an output terminal of the second switch transistor T2 outputs a readable signal R1.

A control terminal of the sensing transistor T3 receives a third scan signal G3, an input terminal of the sensing transistor T3 receives a power signal SVDD, and an output terminal of the sensing transistor T3 is coupled to the first node Q.

The sensing capacitor C1 includes an upper plate coupled to a second node P, and a lower plate of the sensing capacitor C1 coupled to the first node Q, wherein the upper plate of the sensing capacitor C1 is a transparent plate, and the lower plate of the sensing capacitor C1 is a metal plate.

It should be noted that a node refers to a point formed at a juncture of two or more wires electrically connected, which is represented by bold black dots in the drawings of this application. Specifically, the first node Q refers to a node where the output terminal of the first transistor T1, the output terminal of the sensing transistor T3, and the lower plate of the sensing capacitor C1 are electrically connected. The second node P refers to a node where the control terminal of the sensing transistor T3 is electrically connected to the upper plate of the sensing capacitor C1.

In this embodiment of the present application, a material of the upper plate of the sensing capacitor C1 is indium tin oxide (ITO), and the lower plate of the sensing capacitor C1 is made of a metal material. For example, a material of the lower plate of the sensing capacitor C1 may be metal molybdenum, copper, aluminum, or other composite metal materials, or a material of the lower plate of the sensing capacitor C1 may also be metal oxide materials such as indium tin oxide.

In current multifunctional display panels, a multifunctional capacitor is provided by arranging two opposing conductive layers in a functional area, and insulating materials, such as silicon nitride and silicon oxide are disposed in a middle between the opposing conductive layers to fulfill functions, such as color temperature sensing, gas sensing, or laser sensing. However, such a configuration occupies a larger area and greatly reduces an aperture ratio of display panels.

In this embodiment, please refer to FIG. 2. A first common electrode 103 of the present embodiment may double as the lower plate of the sensing capacitor C1, and a first pixel electrode 104 may double as the upper plate of the sensing capacitor C1.

Since the upper plate of the sensing capacitor C1 is a transparent structure, the functional area FA can also serve a displaying function while performing color temperature sensing, gas sensing, or laser sensing, which improves an aperture ratio and transmittance of the display panel 100, thereby enhancing an overall visual effect of the display panel 100.

The embodiment of the present application improves the first driving circuit 10 in the functional area FA, modifies a conventional 2T1C (two transistors and one capacitor) driving circuit structure as a 3T1C (three transistors and one capacitor) driving circuit structure, and performs a periodic setting on a signal source of the first driving circuit 10, so that the functional area FA can achieve an effect of the display area.

A control terminal of the display transistor T4 receives a fourth scan signal G4, an input terminal of the display transistor T4 receives a second data signal D2, an output terminal of the display transistor T4 is coupled to a first plate of the storage capacitor C2, and a first terminal of the light-emitting device L is coupled to a second plate of the storage capacitor C2.

In some embodiments, the first plate of the storage capacitor C2 is arranged on a same layer as the upper plate of the sensing capacitor C1, and the second plate of the storage capacitor C2 is arranged on a same layer as the lower plate of the sensing capacitor C1.

In the embodiment of the present application, a material of the first plate of the storage capacitor C2 is indium tin oxide (ITO), and the second plate of the storage capacitor C2 is made of a metal material. For example, a material of the second plate of the storage capacitor C2 may be metal molybdenum, copper, aluminum, or other composite metal materials, or a material of the second plate of the storage capacitor C2 may also be metal oxide materials such as indium tin oxide.

It should be noted that, with reference to FIG. 2, a second common electrode 101 of the present embodiment may double as the second plate of the storage capacitor C2, and a second pixel electrode 102 may double as the first plate of the storage capacitor C2.

In some embodiments, the first pixel electrode 104 and the second pixel electrode 102 are arranged in a same layer, that is, the first pixel electrode 104 and the second pixel electrode 102 can be formed by a same mask process. The first pixel electrode 104 and the second pixel electrode 102 may be made of indium tin oxide or the like.

In some embodiments, the first common electrode 103 and the second common electrode 101 may be disposed on a substrate 105 in a same layer and covered by a gate insulating layer 106.

The embodiment of the present application provides the upper plate of the sensing capacitor C1 as a transparent structure in the functional area FA and modifies the first driving circuit 10 located in the functional area FA, so that the functional area FA is configured to not only perform signal detection, but also enable a display function. The display panel of the embodiment of the present application improves an aperture ratio and transmittance, and realizes a narrow frame design of the display panel.

Figure 5:
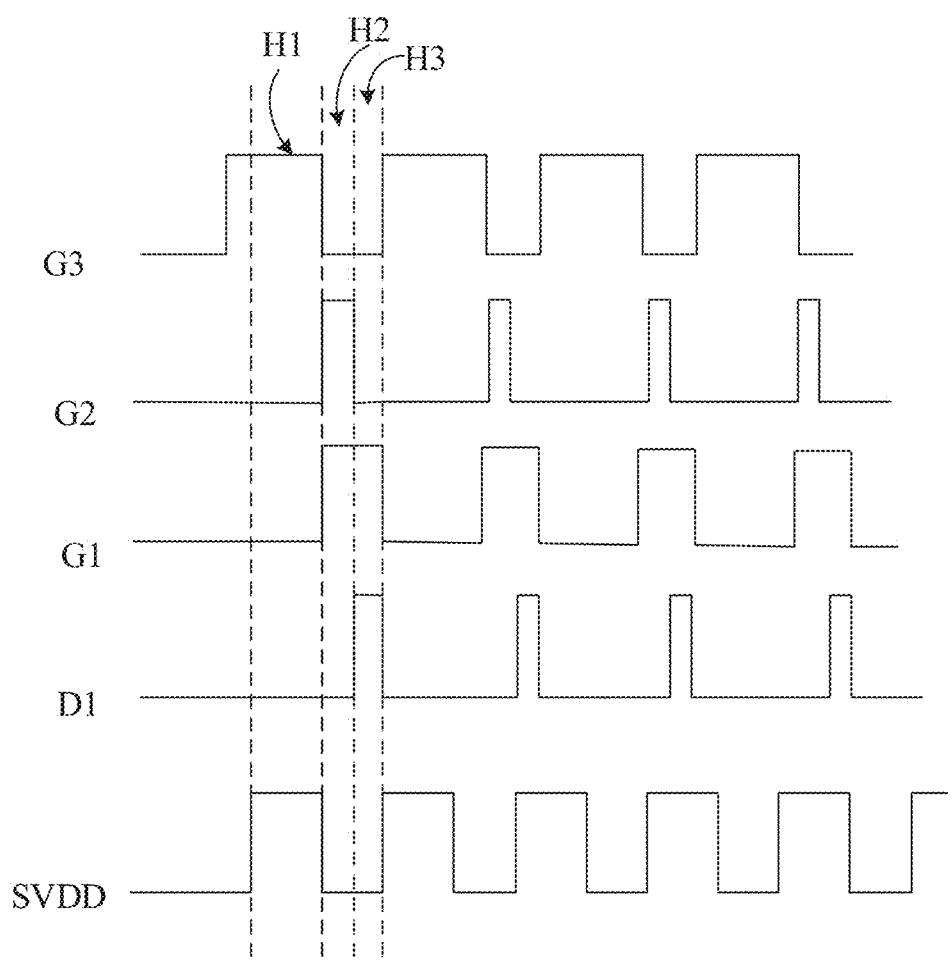
FIG. 5 is a timing diagram of the first driving circuit of the display panel provided by the embodiment of the present application.

Please refer to FIGS. 3, 4, and 5. FIG. 5 is a timing diagram of the first driving circuit of the display panel provided by the embodiment of the present application. A plurality of combinations of voltage levels of the first scan signal G1, the first data signal D1, the second scan signal G2, the third scan signal G3, and the power signal SVDD are corresponding to a detection phase H1, a read phase H2, and a display phase H3, sequentially.

In the detection phase H1, the third scan signal G3 and the power signal SVDD are at a high voltage level, and the first data signal D1, the first scan signal G1, and the second scan signal G2 are at a low voltage level. That is, a third scan line inputs the third scan signal G3, so that the sensing transistor T3 is turned on. At a same time, a power signal line inputs the power signal SVDD, and when laser irradiation or temperature heating is applied to the sensing transistor T3, the sensing transistor T3 will generate different numbers of carriers, and then produce different intensities of current, wherein electric current is stored in the sensing capacitor C1 in form of electricity.

In the read phase H2, the first scan signal G1 and the second scan signal G2 are at a high voltage level, and the first data signal D1, the third scan signal G3, and the power signal SVDD are at a low voltage level. Specifically, in the read phase H2, the third scan line and the power signal line stop receiving signals, that is, the third scan signal G3 and the power signal SVDD are both at the low voltage level. At this time, the sensing transistor T3 is turned off. When the first scan signal G1 and the second scan signal G2 are at the high voltage level, the first switch transistor T1 and the second switch transistor T2 are turned on to release the electricity stored in the sensing capacitor C1, so that the signals can be read by read lines. In this manner, a process of signal reading is completed.

In the display phase H3, the first data signal D1 and the first scan signal G1 are at a high voltage level, and the second scan signal G2, the third scan signal G3, and the power signal SVDD are at a low voltage level. Specifically, the first scan signal G1 and the first data signal D1 are at the high voltage level, and the second scan signal G2, the third scan signal G3, and the power signal SVDD are at the low voltage level. In the display phase H3, the second data signal D2 and the fourth scan signal G4 cooperating with the display transistor T4 are input to the sensing capacitor C1 through the first switch transistor T1 for displaying by a desired voltage.

In the display phase H3, the first driving circuit 10 and the second driving circuit 20 cooperatively operate, so that after the first driving circuit 10 completes a process of storing and releasing the electricity, the first driving circuit 10 and the second driving circuit 20 work together to achieve displaying.

In some embodiments, the detection phase H1, the read phase H2, and the display phase H3 are defined as a period, and the period is between one microsecond and 10 seconds. For example, a period may be any one of one microsecond, 10 microseconds, 100 microseconds, 1000 microseconds, 10000 microseconds, 100000 microseconds, or 1000000 microseconds. In the embodiment of the present application, the period is set between one microsecond and 10 seconds to ensure that there is sufficient time to store and release the electricity, thereby ensuring display performance.

It should be noted that a time of each of the detection phase H1, the read phase H2, and the display phase H3 is not limited in the embodiment of the present application.

In some embodiments, since the detection phase H1 is performed to store the electricity, the time of the detection phase H1 can be set between 10 microseconds and 1000 microseconds to ensure that there is sufficient time for electricity storage. Because a discharge process of the electricity is relatively short, the time of the read phase H2 is set between one microsecond and 1000 microseconds. In the display phase H3, the first driving circuit 10 and the second driving circuit 20 cooperate, so that after the first driving circuit 10 completes the process of storing and releasing the electricity, the first driving circuit 10 and the second driving circuit 20 work together to achieve displaying. Therefore, the time of the display stage H3 is set between one microsecond and 100000 microseconds to provide better display performance.

In some embodiments, a time period of the detection phase H1 is longer than a time period of the read phase H2 and a time period of the display phase H3, wherein the time period of the read phase H2 may be equal to the time period of the display phase H3, or the time period of the read phase H2 is longer than or shorter than the time period of the display phase H3, which is not limited herein.

In some embodiments, a time of a rising edge of the third scan signal G3 is earlier than a time of a rising edge of the power signal SVDD to ensure that the third scan signal G3 is transmitted to the second node P, thereby turning on the sensing transistor T3.

Figure 6:
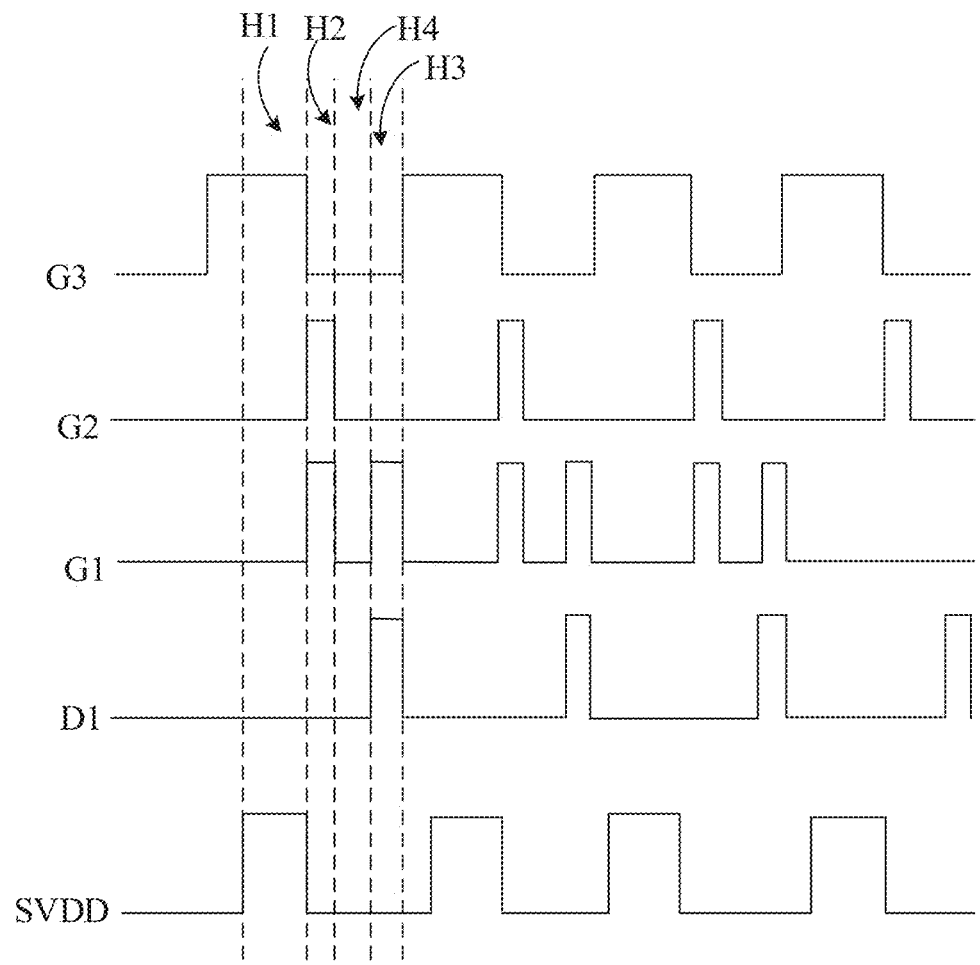
FIG. 6 is another timing diagram of the first driving circuit of the display panel provided by the embodiment of the present application.

Please refer to FIG. 6, which is another timing diagram of the first driving circuit of the display panel provided by the embodiment of the present application. A combination of the voltage levels of the first scan signal G1, the first data signal D1, the second scan signal G2, the third scan signal G3, and the power signal SVDD is further corresponding to a recovery phase H4 defined between the read phase H2 and the display phase H3.

In the recovery phase H4, the first scan signal G1, the first data signal D1, the second scan signal G2, the third scan signal G3, and the power signal SVDD are all at a low voltage level. That is, in the recovery phase H4, the first switch transistor T1, the second switch transistor T2, and the sensing transistor T3 do not apply a signal. In addition, electric current in the first switch transistor T1, the second switch transistor T2, the sensing transistor T3, and a circuit are released, so as not to affect phase current or other signals in the detection phase H1, the read phase H2, or the display phase H3, thereby preventing a phenomenon of signal crosstalk.

It should be noted that in some embodiments, the detection phase H1, the read phase H2, the recovery phase H4, and the display phase H3 are defined as a period, and the period is between one microsecond and 10 seconds. For example, a period may be any one of one microsecond, 10 microseconds, 100 microseconds, 1000 microseconds, 10000 microseconds, 100000 microseconds, or 1000000 microseconds. In the embodiment of the present application, the period is set between one microsecond and 10 seconds to ensure that there is sufficient time to store and release the electricity, thereby ensuring display performance.

It should be noted that a time of each of the detection phase H1, the read phase H2, the recovery phase H4, and the display phase H3 is not limited in the embodiment of the present application.

In some embodiments, since the detection phase H1 is performed to store the electricity, the time of the detection phase H1 can be set between 10 microseconds and 1000 microseconds to ensure that there is sufficient time for electricity storage. Because a discharge process of the electricity is relatively short, the time of the read phase H2 is set between one microsecond and 1000 microseconds. In the recovery phase H4, the electric current in the first switch transistor T1, the second switch transistor T2, the sensing transistor T3, and the circuit needs to be released, so as not to affect the phase current or other signals in the detection phase H1, the read phase H2, or the display phase H3, and to prevent the phenomenon of signal crosstalk. Therefore, the time of the recovery stage H4 is set between one microsecond and 1000 microseconds to ensure that the electric current in the circuit is completely released, and to prevent the phenomenon of signal crosstalk. In the display phase H3, the first driving circuit 10 and the second driving circuit 20 cooperate, so that after the first driving circuit 10 completes the process of storing and releasing the electricity, the first driving circuit 10 and the second driving circuit 20 work together to achieve displaying. Therefore, the time of the display stage H3 is set between one microsecond and 100000 microseconds to provide better display performance.

In some embodiments, a time period of the detection phase H1 is longer than a time period of the read phase H2, a time period of the recovery phase H4, and a time period of the display phase H3, wherein the time period of the read phase H2 may be equal to the time period of the display phase H3, or the time period of the read phase H2 is longer than or shorter than the time period of the display phase H3, and a time period of the recovery phase H4 is longer than the time period of the read phase H2, which is not limited herein.

In some embodiments, a time of a rising edge of the third scan signal G3 is earlier than a time of a rising edge of the power signal SVDD to ensure that the third scan signal G3 is transmitted to the second node P, thereby turning on the sensing transistor T3.

In some embodiments, the first switch transistor T1, the second switch transistor T2, and the sensing transistor T3 are any one of a low temperature polysilicon thin-film transistor, an oxide semiconductor thin-film transistor, or an amorphous silicon thin-film transistor. The display transistor T4 is any one of a low-temperature polysilicon thin-film transistor, an oxide semiconductor thin-film transistor, or an amorphous silicon thin-film transistor. It is not limited here.

Figure 7:
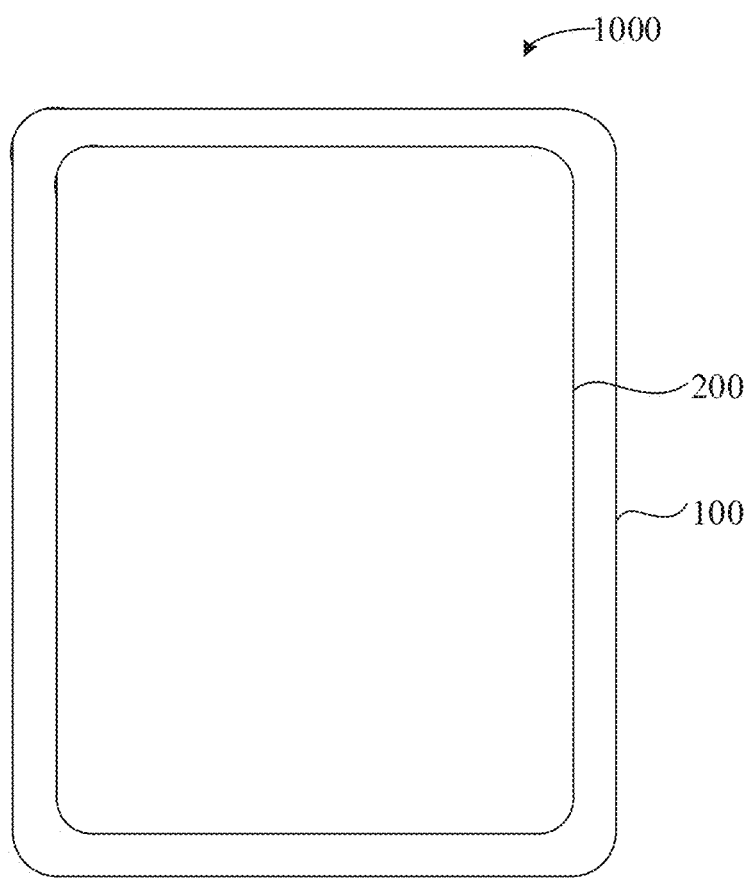
FIG. 7 is a schematic view of an electronic device provided by an embodiment of the present application.

Please refer to FIG. 7, which is a schematic view of an electronic device provided by an embodiment of the present application. An electronic device 1000 includes the display panel 100 and a touch assembly 200 disposed on the display panel 100 or integrated in the display panel 100.

Specifically, the electronic device 1000 may be any of an e-book, a tablet, a TV, or a mobile phone.

An embodiment of the present application provides a display panel and an electronic device. The display panel includes a display area and a functional area. The functional area includes a first switch transistor, a second switch transistor, a sensing transistor, and a sensing capacitor. Specifically, an upper plate of the sensing capacitor is a transparent plate. The functional area can also serve a displaying function while performing color temperature sensing, gas sensing, or laser sensing, which improves an aperture ratio and transmittance of the display panel, thereby enhancing an overall visual effect of the display panel.

In addition, the embodiment of the present application improves driving circuits in the functional area, modifies a conventional 2T1C (two transistors and one capacitor) driving circuit structure as a 3T1C (three transistors and one capacitor) driving circuit structure, and performs a periodic setting on a signal source of the driving circuits, so that the functional area can achieve an effect of the display area.

In summary, although the present invention has been disclosed as a preferred embodiment, it is not intended to limit the present invention. Those of ordinary skill in the art can make various changes and modifications without departing from the spirit and scope of this application. Therefore, the protection scope of this application is subject to the scope defined by the claims.

What is claimed is:

1. A display panel, comprising a display area and a functional area, the display area defined on a side of the functional area, and the functional area comprising a first driving circuit, wherein the first driving circuit comprises:
   a first switch transistor comprising a control terminal receiving a first scan signal, an input terminal included in the first switch transistor receiving a first data signal, and an output terminal included in the first switch transistor coupled to a first node;
   a second switch transistor comprising a control terminal receiving a second scan signal, an input terminal included in the second switch transistor receiving the first data signal, and an output terminal included in the second switch transistor outputting a readable signal;
   a sensing transistor comprising a control terminal receiving a third scan signal, an input terminal included in the sensing transistor receiving a power signal, and an output terminal included in the sensing transistor coupled to the first node; and
   a sensing capacitor comprising an upper plate coupled to a second node, and a lower plate coupled to the first node, wherein the upper plate of the sensing capacitor is a transparent plate, and the lower plate of the sensing capacitor is a metal plate.

2. The display panel of claim 1, wherein a plurality of combinations of voltage levels of the first scan signal, the first data signal, the second scan signal, the third scan signal, and the power signal are corresponding to a detection phase, a read phase, and a display phase, sequentially.

3. The display panel of claim 2, wherein in the detection phase, the third scan signal and the power signal are at a high voltage level, and the first data signal, the first scan signal, and the second scan signal are at a low voltage level.

4. The display panel of claim 2, wherein in the read phase, the first scan signal and the second scan signal are at a high voltage level, and the first data signal, the third scan signal, and the power signal are at a low voltage level.

5. The display panel of claim 2, wherein in the display phase, the first data signal and the first scan signal are at a high voltage level, and the second scan signal, the third scan signal, and the power signal are at a low voltage level.

6. The display panel of claim 2, wherein one of the combinations of the voltage levels of the first scan signal, the first data signal, the second scan signal, the third scan signal, and the power signal is further corresponding to a recovery phase defined between the read phase and the display phase.

7. The display panel of claim 6, wherein each of the first scan signal, the first data signal, the second scan signal, the third scan signal, and the power signal is at a low voltage level in the recovery phase.

8. The display panel of claim 2, wherein the detection phase, the read phase, and the display phase are defined as a period, and the period is between one microsecond and 10 seconds.

9. The display panel of claim 1, wherein a second driving circuit is disposed in the display area and comprises a display transistor, a storage capacitor, and a light-emitting device;
wherein the display transistor comprises a control terminal receiving a fourth scan signal, an input terminal included in the display transistor receiving a second data signal, an output terminal included in the display transistor coupled to a first plate included in the storage capacitor, and a first terminal included in the light-emitting device coupled to a second plate included in the storage capacitor.

10. The display panel of claim 9, wherein the first plate of the storage capacitor and the upper plate of the sensing capacitor are arranged in a same layer, and the second plate of the storage capacitor and the lower plate of the sensing capacitor are arranged in a same layer.

11. An electronic device, comprising a display panel and a touch assembly disposed on the display panel or integrated in the display panel, the display panel comprising a display area and a functional area, the display area defined on a side of the functional area, and the functional area comprising a first driving circuit, wherein the first driving circuit comprises:
a first switch transistor comprising a control terminal receiving a first scan signal, an input terminal included in the first switch transistor receiving a first data signal, and an output terminal included in the first switch transistor coupled to a first node;
a second switch transistor comprising a control terminal receiving a second scan signal, an input terminal included in the second switch transistor receiving the first data signal, and an output terminal included in the second switch transistor outputting a readable signal;
a sensing transistor comprising a control terminal receiving a third scan signal, an input terminal included in the sensing transistor receiving a power signal, and an output terminal included in the sensing transistor coupled to the first node; and
a sensing capacitor comprising an upper plate coupled to a second node, and a lower plate coupled to the first node, wherein the upper plate of the sensing capacitor is a transparent plate, and the lower plate of the sensing capacitor is a metal plate.

12. The electronic device of claim 11, wherein a plurality of combinations of voltage levels of the first scan signal, the first data signal, the second scan signal, the third scan signal, and the power signal are corresponding to a detection phase, a read phase, and a display phase, sequentially.

13. The electronic device of claim 12, wherein in the detection phase, the third scan signal and the power signal are at a high voltage level, and the first data signal, the first scan signal, and the second scan signal are at a low voltage level.

14. The electronic device of claim 12, wherein in the read phase, the first scan signal and the second scan signal are at a high voltage level, and the first data signal, the third scan signal, and the power signal are at a low voltage level.

15. The electronic device of claim 12, wherein in the display phase, the first data signal and the first scan signal are at a high voltage level, and the second scan signal, the third scan signal, and the power signal are at a low voltage level.

16. The electronic device of claim 12, wherein one of the combinations of the voltage levels of the first data signal, the second scan signal, the third scan signal, and the power signal is further corresponding to a recovery phase defined between the read phase and the display phase.

17. The electronic device of claim 16, wherein each of the first scan signal, the first data signal, the second scan signal, the third scan signal, and the power signal is at a low voltage level in the recovery phase.

18. The electronic device of claim 12, wherein a second driving circuit is disposed in the display area and comprises a display transistor, a storage capacitor, and a light-emitting device;
wherein the display transistor comprises a control terminal receiving a fourth scan signal, an input terminal included in the display transistor receiving a second data signal, an output terminal included in the display transistor coupled to a first plate included in the storage capacitor, and a first terminal included in the light-emitting device coupled to a second plate included in the storage capacitor.

19. The electronic device of claim 18, wherein the first plate of the storage capacitor and the upper plate of the sensing capacitor are arranged in a same layer, and the second plate of the storage capacitor and the lower plate of the sensing capacitor are arranged in a same layer.

20. The electronic device of claim 12, wherein the detection phase, the read phase, and the display phase are defined as a period, and the period is between one microsecond and 10 seconds.

* * * * *